United States Patent [19]

Ahmed

[11] 4,297,644
[45] Oct. 27, 1981

[54] AMPLIFIER WITH CROSS-OVER CURRENT CONTROL

[75] Inventor: Adel A. A. Ahmed, Clinton Township, Hunterdon County, N.J.

[73] Assignee: RCA Corporation, New York, N.Y.

[21] Appl. No.: 96,739

[22] Filed: Nov. 23, 1979

[51] Int. Cl.³ .............................................. H03F 3/30
[52] U.S. Cl. .................................... 330/264; 330/268
[58] Field of Search ........................ 330/264, 267, 268

[56] References Cited

U.S. PATENT DOCUMENTS

| | | | |
|---|---|---|---|
| 3,914,702 | 10/1975 | Gehweiler | 330/264 |
| 3,997,849 | 12/1976 | Thommen | 330/267 X |
| 4,038,607 | 7/1977 | Schade | 330/264 |
| 4,159,450 | 6/1979 | Hoover | 330/264 |

FOREIGN PATENT DOCUMENTS

| | | |
|---|---|---|
| 54-101249 | 8/1979 | Japan ................................. 330/264 |
| 1460605 | 1/1977 | United Kingdom . |
| 1507525 | 4/1978 | United Kingdom . |

*Primary Examiner*—James B. Mullins
*Attorney, Agent, or Firm*—Paul J. Rasmussen; Allen L. Limberg; Allan J. Jacobson

[57] ABSTRACT

A complementary field-effect transistor (FET) amplifier with means for controlling peak cross-over current. A substantially constant current is established in the drain-source conduction paths of a pair of reference transistors by degenerative feedback from the conduction paths to the respective gate electrodes thereof; wherein the reference transistors have similar characteristics to the respective amplifier transistors. The resulting sum of the gate-to-source voltages of the reference transistors is used to apply a bias voltage between the gate electrodes of the transistors in the FET amplifier so that the sum of the gate-to-source voltages of the amplifier transistors is equal to the sum of the respective gate-to-source voltages of the reference transistors during the cross-over current condition. Cross-over current is thereby limited to a predetermined value proportional to the substantially constant current established through the reference transistors.

9 Claims, 6 Drawing Figures

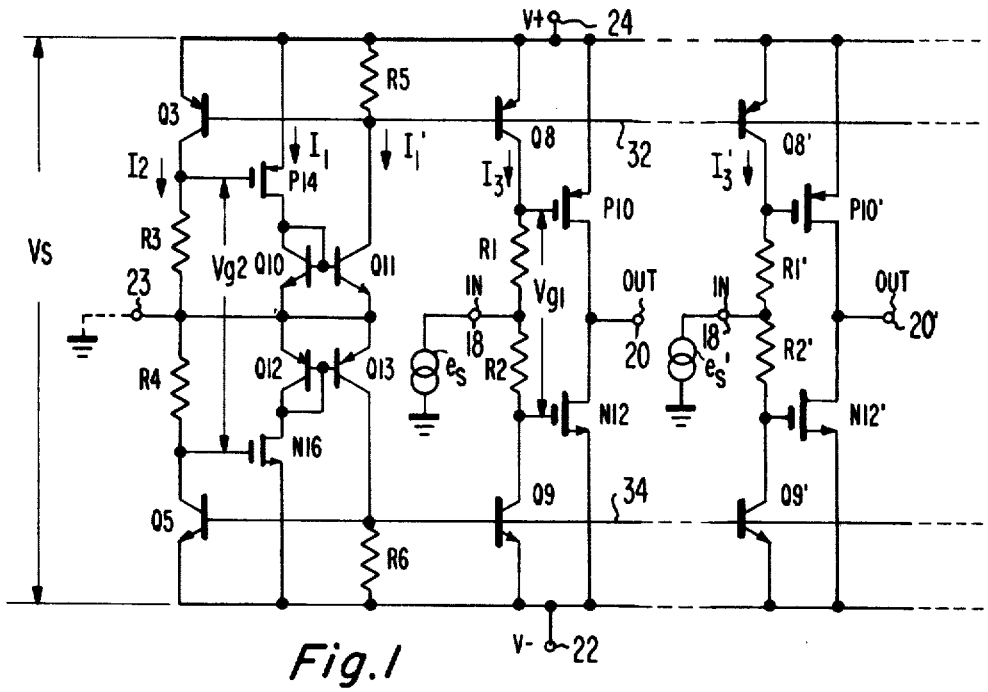

even values of cross-over current regardless of the value of the operating potential.

AMPLIFIER WITH CROSS-OVER CURRENT CONTROL

This invention relates to complementary symmetry field-effect-transistor amplifiers, and more particularly this invention relates to means for biasing the gate electrodes of a complementary symmetry amplifier to control the maximum value of cross-over current therein.

A complementary symmetry amplifier comprises two field-effect transistors (FET) of opposite conductivity types, the respective channels of which are serially connected across a source of operating potential. An input terminal is connected to the gate electrode of both transistors. The interconnection between the two channels of the transistors is connected to an output terminal. A typical inverting amplifier is connected drain-to-drain with the source electrodes connected across the operating potential.

Complementary symmetry circuits are attractive as digital logic elements because of their high threshold against noise, low power consumption and very high power gain. When the input to a complementary symmetry amplifier is at a logical high or low, one of the two FET devices is on and the other is off. Thus, for a steady logic input level to the amplifier, only a small current flows, equal to the leakage current of either transistor in the off state. As the amplifier switches states, the drain current increases from a low steady-state value, rises to a peak, then decreases again to another steady-state value. The operating range where both transistors are partially on is termed the "analog region", and the peak switching current which occurs when the sum of the two channel resistances is minimum is called the "cross-over current".

A complementary symmetry inverter amplifier as described above may be operated as a Class A linear or Class AB quasi-linear amplifier, retaining many of the desirable characteristics associated with its use as a digital logic element. For such analog applications, the amplifier is biased at a quiescent operating point along its transfer function where input and output voltage is approximately linearly related. A usual bias point is mid-point, where the quiescent input voltage is set so that the output voltage is one-half of the power supply operating potential. Such mid-point quiescent bias sets up a so-called "idling current" through the channels of the FET's which idling current essentially corresponds to the "cross-over current" described above.

The power consumption of a complementary symmetry amplifier is related to the magnitude of the cross-over current and the proportion of the time that the amplifier is operated in the analog region. For digital circuits, it can be seen that the power consumption is related to switching frequency. Since cross-over current is a strong function of power supply voltage, power consumption increases at higher supply voltages. Also, environmental factors such as temperature affect the magnitude of the cross-over current, which generally increases for increasing temperature. Variations in manufacturing processes and materials which affect device parameters will also affect the value of cross-over current.

Under certain conditions, such as high power supply voltage or high temperature, the cross-over current can be excessive, resulting in excessive power consumption. Therefore, it is desirable to control the cross-over current to a substantially constant peak value independent of power supply voltage and FET device parameters. For analog operation, such cross-over current control means that the quiescent operating point will be stable in the presence of changing power supply and temperature conditions as well as being set independently of unit-to-unit variations in FET device parameters.

In the present invention, cross-over current in a complementary symmetry FET amplifier, comprising first and second transistors, is controlled by regulating the current flows through the conduction channels of third and fourth transistors, and applying the resulting gate-to-source voltages of the third and fourth transistors to bias the respective gate-to-source electrodes of the first and second transistors. In one embodiment, the third and fourth transistors are self-biased to a predetermined cross-over operating point by feedback means connecting respective drain-to-gate electrodes. In another embodiment, the third and fourth transistors are connected in series with means for establishing a substantially constant current through the conduction channels thereof. Cross-over current in the first and second transistors is controlled by applying a voltage derived from the resulting sum of the source-to-gate electrode voltages of the third and fourth transistors to the respective gate electrodes of the first and second transistors.

IN THE DRAWINGS

FIG. 1 is a schematic diagram of a plurality of complementary symmetry amplifiers operated from a single cross-over current control means which circuitry embodies the present invention.

FIG. 2 is a multiple graph plotted on the same axes showing two different respective operating points for a complementary symmetry amplifier with cross-over current control, illustrating the operation of the present invention.

Figure 4:
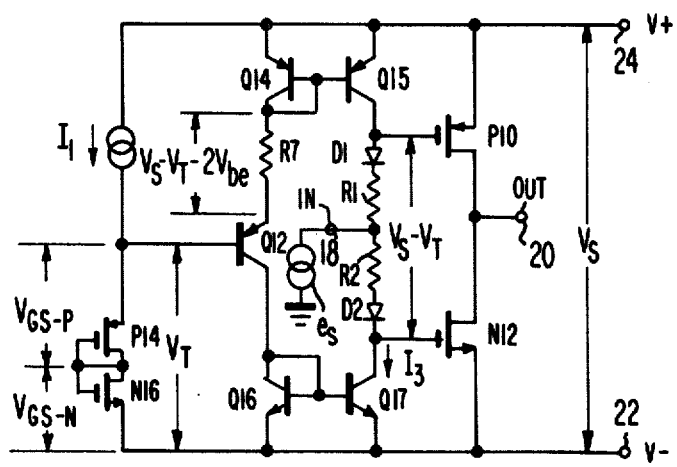
Figure 5:
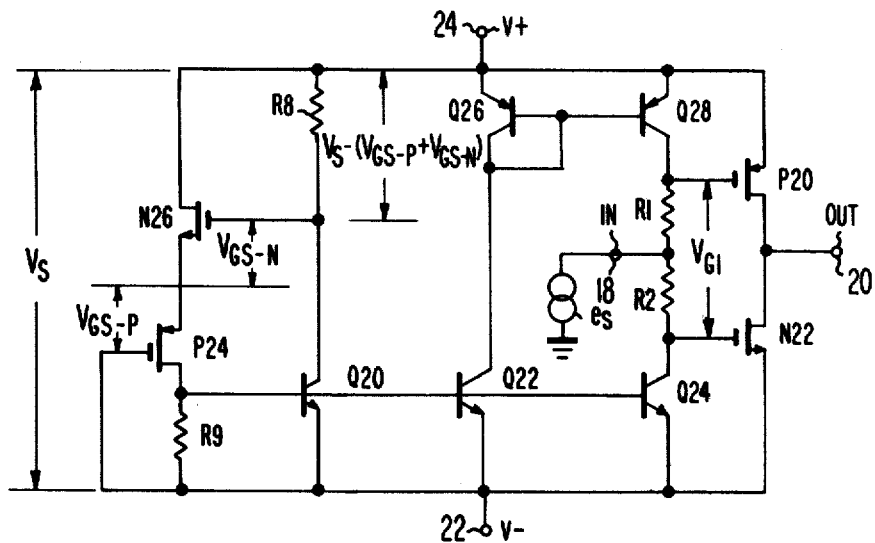

Each of FIGS. 3, 4 and 5 is a schematic diagram of a complementary symmetry amplifier with cross-over current control embodying the present invention.

Figure 6:
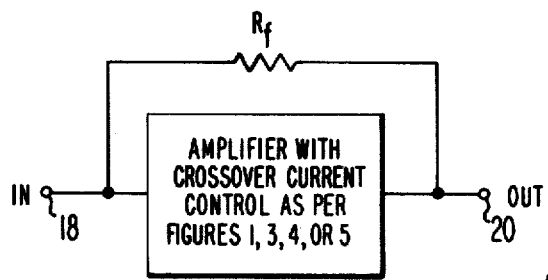

FIG. 6 shows a means for biasing a complementary symmetry amplifier for linear operation.

A complementary symmetry amplifier is shown in FIG. 1. A P-channel enhancement-type FET, P10, is connected in series with a N-channel enhancement-type FET, N12. The drain electrodes thereof are connected in common to output terminal 20. The respective source electrodes are connected to terminals 24 and 22 respectively which receive respective power supply potentials V+ and V−. The gate electrode of each FET, P10, N12, is connected to input terminal 18 via resistors R1 and R2 respectively.

If it is assumed that the voltage drop across R1 and R2 is zero, then transistors P10 and N12 function as a conventional complementary symmetry inverting amplifier, well known in the art. The respective gates of the transistors are at the same potential. When the input 18 is low (at V− potential), N12 is completely cut off and P10 is fully conducting. Therefore, the output 20 is high (at V+ potential). Conversely, when the input 18 is high, N12 is on and P10 is off and the output is low. Transistor P10 and N12 therefore function as a digital inverter.

Between the two extremes of input potential described above, there is a range of input signal at which transistors P10, N12 will both be partially on. The drain current increases sharply when both transistors are on, to a peak value as determined by the power supply operating potential and the channel resistance of P10 and N12. Cross-over current, which is the peak switching current, occurs when the sum of both channel resistances is minimum.

In the present invention cross-over current is controlled to a predetermined value substantially independent of power supply voltage and FET device parameters. The general principle is set forth as follows: a prescribed channel current is forced to flow through the channels of a pair of reference transistors (P14 and N16) whose characteristics match and track those of the amplifier transistors (P10 and N12). The gate-to-source voltages of the reference transistors for such prescribed channel current are summed together. A voltage, derived from the sum of the gate-source voltages is then applied between the gates of the amplifier transistors. Now, rather than the gates of the transistors being at the same potential, the gates are separated by a potential proportional to the operating potential minus the sum of the gate-to-source voltages of the reference transistors.

FIG. 2 graphically illustrates the effect of inserting a voltage separation between the gates of the amplifier. The horizontal axis is the gate-to-source voltage, $V_{GS}$; the vertical axis is the drain-to-source current, $I_{DS}$. Curve 28 represents the gate voltage-to-drain current characteristics of a P-channel FET. Curve 30, plotted on the same axes, represents the gate voltage-to-drain current characteristics of a complementary N-channel transistor. In the prior art complementary symmetry amplifier, both gate electrodes are connected in common. Therefore, the intersection of curves 28 and 30 is where the maximum, or cross-over, current occurs. Now consider the effect of introducing an offset, or separation voltage, in series with the respective gate electrode of each transistor. The curve 28 shifts left as illustrated by curve 28a. The magnitude of the shift $(V_{P2}-V_{P1})$ corresponds to the voltage drop introduced between input terminal 18 and the gate electrode of the P-channel transistor. Curve 30 shifts right to become curve 30a offset by an amount $(V_{N2}-V_{N1})$ corresponding to the voltage drop introduced between the input terminal 18 and the gate electrode of the N-channel transistor. Shifted curves 28a and 30a intersect at a lower cross-over current $I_B$. The total gate-to-gate voltage separation between the respective gate electrodes of the P-channel and N-channel transistors (at drain current $I_B$) is equal to $V_{g1}$, as indicated in FIG. 2. Note the generally lower value of cross-over current $I_B$ produced by introducing a generally greater voltage separation between the gate electrodes.

The amount of gate voltage separation, or shift of the characteristic curves, is such that the cross-over current is controlled to a predetermined maximum value. As disclosed in the embodiments herein, the voltage separation introduced between the gates is derived from the gate-to-source voltages of a pair of matched reference transistors operated at a substantially constant current. Therefore, curves 28 and 30 will shift in a direction so that they tend to intersect at a predetermined value of cross-over current, $I_B$. For instance, suppose the power supply voltage is increased. Curves 28 and 30 will then be new curves, steeper than before. Their net intersection will tend to be at a higher current level. But the voltage separation between the gates will increase, causing the characteristic curves to shift towards each other, by an amount which tends to keep the cross-over current at the predetermined value $I_B$.

Consider the symmetrical embodiment shown in FIG. 1. An operating potential difference $V_S$ is applied between terminals 24 and 22. Because of the circuit symmetry, terminal 23 is substantially at a potential in the middle between that of power supply potentials V+ and V−. When V+ and V− are of equal magnitude, $V_1/2$, but opposite polarity, terminal 23 will be a virtual ground as indicated in FIG. 1.

Drain current through transistor P14 is regulated by feedback means to a prescribed value $I_1$. The feedback path consists of the master path Q10 of a current mirror means Q10, Q11, in series with the conduction channel of P14, to the slave path Q11 of the current mirror means, through resistor R5, transistor Q3, and resistor R3, which applies potential to the gate of P14. To understand the operation of the feedback regulating mechanism, assume that current mirror means Q10, Q11 has a current gain ratio of minus 1. That is, for a current $I_1$ through the diode-connected master path Q10, the slave path Q11 will demand a current $I_1'$ equal to $I_1$. A unity ratio may be achieved by designing Q10 and Q11 to have the same emitter-base junction area fabricated on a common substrate.

Drain current is primarily determined by the forward biased emitter-based voltage of Q3 and the value of resistor R5. For silicon, $V_{be}$ is about 0.675 volts. Drain current $I_1$ (or $I_1'$) is then $V_{be}/R5$. If $I_1$ tends to increase over the $V_{be}/R5$ value, $I_1'$ will increase also. Since the current to R5 is $V_{be}/R5$, where $V_{be}$ is fairly independent of base current, any increase in $I_1'$ will be conducted through the base-emitter junction of Q3 and amplified by a factor equal to the beta of Q3. Thus, $I_2$ tends to increase sharply which increases the voltage across R3 applied to the gate electrode of P14. More positive voltage on the gate electrode of P14 reduces the gate-to-source voltage thereof which tends to reduce the drain current $I_1$. A similar analysis applies for the reverse situation where $I_1$ tends to fall below $V_{be}/R5$. The feedback is thus seen to be degenerative maintaining channel current $I_1$ equal to $V_{be}/R5$ plus the small base current required to drive transistor Q3 (plus the small base current to Q8 and Q8' discussed below).

The complementary operation of transistor N16 in cooperation with current mirror means Q12, Q13, resistor R6, transistor Q5 and resistor R4 is analagous to that of P14, Q10, Q11, R5, Q3 and R3, respectively, as described above. Since the circuit is symmetrical, corresponding currents $I_1$, $I_1'$, and $I_2$ from the upper half of the circuit in FIG. 1 also flow in respective paths in the lower half of the circuit. Therefore, no current flows via terminal 23 to ground and actually such connection may be eliminated without changing the circuit operation.

The drain current in complementary transistor N16 is also equal to $I_1$. Most important, the voltage across R3 and R4, $V_{g2}$, produced by the equal and opposite currents from Q3 and Q5, is equal to the operating potential $V_S$ less the sum of the gate-to-source voltages of P14 and N16 required to produce a drain current of $I_1$. In other words, transistors Q3 and Q5 act as complementary current sources to produce a $V_{g2}$ across resistors R3 and R4 such that the magnitude of the drain currents of P14 and N16 is equal to $I_1$.

Before considering the operation of the amplifier comprising P10 and N12, assume that transistor Q8 and Q9 are matched to Q3 and Q5, and that the base-emitter junction areas of Q8 and Q9 are equal to that of Q3 and Q5, respectively. Further assume that the resistors R1, R2, R3 and R4 each have the same value of resistance. It can be seen that the current $I_3$ through Q8 and Q9 will be equal to $I_2$. Therefore, the voltage across R1 and R2, indicated by $V_{g1}$ in FIG. 1, will be equal to $V_{g2}$. Now, imagine the input voltage at terminal 18 to correspond to a cross-over current condition. Since the characteristics of P10 and N12 are matched to P14 and N16, respectively, the total voltage across the gate-to-source electrodes of P10 and N12 will be divided between the two devices so that the cross-over current is equal to $I_2$. As indicated above, if the power supply potentials change, or if device-dependent factors such as temperature change, which change tends to increase or decrease the current in the conduction paths of P10 and N12, then the reference transistors will provide adjusted gate-to-source voltages necessary to control the cross-over current to the predetermined value equal to $I_1$.

In operation, the signal source $e_s$ is connected to input terminal 18. For a digital input signal, the complementary symmetry amplifier P10, N12 is still a logical inverter. The voltage drops across R1 and R2 act like a dc offset in series with the input connection to each respective gate. In other respects, the inverter operates normally. The peak switching current, however, which occurs when the input voltage corresponds to an output voltage midway between V+ and V−, will be limited to $I_1$, the prescribed constant current flowing in reference transistors P14 and N16, thus reducing the power consumption of the inverter.

The complementary symmetry amplifier P10, N12 may also be operated as a linear amplifier when biased at the mid-point of its linear range. At such quiescent operating point an idling current flows equal to the cross-over current described above. Note that since cross-over current is equal to a predetermined value, the gain of the amplifier, which is determined by such cross-over current, is also regulated to a predetermined value in the presence of changing conditions.

If it is desired to operate more than one complementary symmetry amplifier with cross-over current control, it is not necessary to construct separate cross-over control circuits. FIG. 1 shows how a plurality of amplifiers may be controlled from a single cross-over current control circuit. Buses 32 and 34 carry base voltage signals to control additional current sources Q8' and Q9'. Each such source Q8' and Q9' respectively supplies or sinks a current equal to $I_2$ through the resistors R1' and R2'. The resulting voltage separation between the gates of P10' and N12' will limit the peak switching current to $I_1$ as before.

Another embodiment employing a somewhat different means for regulating the channel current through the reference transistors is shown in FIG. 3. Here, the drain-to-source channel current flows directly through resistor R6. As before, any channel current greater than $I_1$ equal to $V_{be}/R6$ flows through Q5 and is multiplied by the beta of that transistor. The complementary current source Q3, however, is driven by current mirror means rather than by a separate resistor/transistor combination as before. The current in Q5 is duplicated via a matched transistor Q4. The current through Q4 is inverted and duplicated in a unity gain current mirror Q1, Q2, Q3, and supplied to resistor R3. As before, the gate-to-gate voltage $V_{g2}$ is equal to the operating potential $V_S$ minus the sum of the respective gate-to-source voltages for P14 and N16 necessary to produce a drain current equal to $I_1$ plus the small base current required for Q5 (as well as for Q4 and Q9 in FIG. 3). Transistor Q2 is a base current bypass transistor providing base current drive for Q1, Q3 and Q8, and any other current sources which may be added for additional complementary symmetry amplifiers.

It is noted that one skilled in the art can modify the circuits shown in FIGS. 1 and 3 to use current mirror circuits other than the ones illustrated. A current mirror is defined herein as a linear inverting current amplifier comprising: current-to-voltage converter means responsive to input current for producing a voltage; a voltage-to-current converter means responsive to said voltage for producing the amplifier output; and wherein each converter means exhibits a respective current-/voltage characteristic; which may be non-linear, such characteristics being related by a factor G independent of the magnitude of the current being applied and being selected to track each other with changes in temperature for providing an overall gain wherein the ratio of output current to input current magnitude equals the factor G over substantial ranges of both temperature and the magnitude of the amplified current. Current mirrors may be constructed using either bipolar or FET devices.

The resistor R6 (FIG. 3) can be replaced with a constant current source set to sink a current $I_1$ as set by an external bias. Then, all channel current above $I_1$ will be forced to flow across the base-emitter junction of Q5, as before. Similarly, in FIG. 1 current sources may replace R6 and R5 to provide matching source and sink currents, respectively. Current sources are commonly provided from the collectors of transistors with temperaturecompensated emitter-to-base biasing voltages. Many other circuit substitutions are possible. For instance, the feedback mechanism comprising R6 and Q5 could be replaced by voltage-operated FET devices, and the resistors R1 through R4 may be diode-connected FET transistors. The resulting circuit, which would then be all FET, is suitable for fabrication in complementary metal-oxide-semiconductor (CMOS) technology.

The current mirrors discussed thus far have had unity gain and resistors R1, R2, R3 and R4 have been presumed to be equal. It will be appreciated that the ratio between R1 and R3 (as well as between R2 and R4) may be greater or less than unity and that the current ratios between sources supplying resistors R1 through R4 may be other than unity, and one can still obtain proportional voltage drop across R1 and R2 to that across R3 and R4 by adjusting the relative channel sizes of P10 and N12 vis-a-vis those of P14 and N16 whereby the cross-over current in P10 and N12 may be set at a value proportional to the prescribed current $I_1$ set in P14 and N16. Note however, that each complementary pair of current sources (e.g., Q8 and Q9) preferably should be operated with equal and opposite current values unless some sort of direct-coupled feedback is provided from the output terminal 20 to the input terminal 18. On the other hand, it is useful in some instances to arrange for input terminals to digital circuits to automatically go to a preferred logic condition, e.g. V+ or V−, when no connection is made to the input terminal. For example, a preferred logic condition may be desired when the input is left unconnected because less standby power is then consumed by subsequent circuits. This effect is obtained in a circuit embodying the present invention by the introduction of a small magnitude unbalance in, for example, the currents supplied by Q8 and Q9 collectors. Furthermore, the resistance values R1 and R2 (or R3 and R4) may be unequal to each other in order to shift the point of input voltage at which the cross-over current flows.

Another embodiment of the present invention is shown in FIG. 4. Reference transistors P14 and N16 are each diode-connected (drain-to-gate connected) FETS in series with a constant current source $I_1$. The order of the series connection of diode-connected transistors P14 and N16 may be reversed. Current source $I_1$ is set by external means or by independent internal reference means. As explained below, the prescribed constant current $I_1$ will determine the controlled value for cross-over current.

The total voltage $V_T$ across both devices is the sum of the gate-to-source voltages for the P-type device $V_{GS-P}$ and the N-type device $V_{GS-N}$ at which the channel current $I_1$ flows. The remainder of the circuit is a means for applying a voltage derived from $V_T$ as a voltage separation between the gates of P10 and N12. By Kirchhoff's voltage law, the voltage across R7 must be the operating potential $V_S$ less $V_T$, less the forward-biased base-emitter voltage drop across Q12 and Q14. These base-emitter voltage drops are assumed equal and represented in FIG. 4 as 2 $V_{be}$. Transistor Q14 is the master path of current mirror means Q14, Q15. Similarly, Q16 is the master path of current mirror means Q16, Q17. Now assume that each such current mirror means has unity gain, that R7 is equal to the sum of R1 plus R2, and that each diode, D1 and D2, has a forward bias voltage drop equal to 1 $V_{be}$.

The current in R7 flows through Q14 and, with a small base current error due to Q12, also flows through Q16. Since the slave paths of the current mirror means provide the same current through R1 and R2, the voltage across R1 and R2 will be the same as the voltage across R7. Diode D1 and D2 add another 2 $V_{be}$ to this voltage. Thus, a voltage separation is introduced between the gate electrodes of P10 and N12 equal to the operating potential, $V_S$, less the sum of the gate-to-source potential necessary to produce a channel current equal to $I_1$. Note that D1 and D2 can alternatively be placed in series with the source electrodes of P10 and N12. In less critical applications D1 and D2 may be replaced by respective direct, relatively impedance-free connections.

Yet another embodiment of the present invention is shown in FIG. 5. Reference transistors N26 and P24 are connected source-to-source in series with resistor R9 across the operating potential $V_S$. The feedback loop for regulating the current in the reference transistors comprises transistor Q20 and resistor R8. The regulated channel current will be $I_1$ equal to $V_{be}/R9$, where $V_{be}$ is the forward-biased base-emitter voltage drop for Q20. Current in excess of $V_{be}/R9$ will flow through the base-emitter junction of Q20, and be multiplied by the beta of Q20 as the collector current thereof, which collector current flows through R8. Such action decreases the gate-to-source voltages available to condition N26 and P24 for conduction. The net result is that channel current through N26 and P24 tends to stabilize as $I_1$ equal to $V_{be}/R9$ plus the small base current required for Q20, Q22, and Q24. By Kirchhoff's voltage law, the potential across R8 is equal to the operating potential $V_s$ minus the sum of both gate-to-source voltages ($V_{GS-P} + V_{GS-N}$) of the reference transistors.

Current sources Q22 and Q24, in conjunction with current mirror means Q26, Q28 operate to apply a voltage derived from the voltage across R8 to the gate electrodes of P20 and N22. First, the current through R8 (the same current as through Q20) is inverted and duplicated in matched transistor Q22 and again in matched transistor Q24. Current through transistor Q22 is supplied to the master path Q26 of unity gain current mirror means Q26, Q28. The slave path Q28 supplies a current through R1 and R2 equal and opposite to the curent demanded by Q24. Assuming R1 plus R2 equals R8, the gate separation voltage $V_{g1}$ will be equal to the voltage across R8. Therefore, cross-over current in P10 and N12 will be limited to the channel current in the reference transistors. As mentioned earlier, current mirror ratios and resistor ratios may be varied to provide a cross-over current in proportion to the current through the reference transistors.

As an example of a biasing means for conditioning any of the amplifier circuits shown in FIGS. 1, 3, 4 or 5 for linear operation, FIG. 6 shows a feedback resistor $R_f$ connected from output terminal 20 to input terminal 18. Such feedback bias means, when used with the circuit of FIG. 4, for example, tends to cancel any imbalance between current sources Q15 and Q17. Complementary symmetry amplifiers in accordance with the present invention are particularly useful in analog applications employing linearizing feedback because the cross-over current control tends to stabilize the open loop gain of the amplifier. For example, the cross-over current control techniques discussed herein may be used to provide a voltage separation between the gate electrodes of a complementary symmetry FET push-pull driver stage of the type found in U.S. Pat. No. 4,159,450 to Merle V. Hoover, entitled "COMPLEMENTARY-FET DRIVER CIRCUITRY FOR PUSH-PULL CLASS B TRANSISTOR AMPLIFIERS".

Furthermore, one skilled in the art will be able to design still other circuits using the basic principle of the present invention as disclosed herein. For example, FIG. 4 might be modified replacing diodes D1 and D2 by direct connections in the case where one wished to multiply up the transconductance of P10 by inserting between its source and V+ rail the input circuit of a PNP-transistor current mirror amplifier with output connection to terminal OUT and wishes to multiply up the transconductance of N12 by inserting between its source and V— rail the input circuit of an NPN-transistor current mirror amplifier also with output connection to terminal OUT. Therefore, the embodiments described are in all respects to be regarded as illustrative and not restrictive, the scope of the invention being indicated by the appended claims.

What is claimed is:

1. A complementary symmetry amplifier comprising:
   first, second, third, and fourth field-effect transistors, each having respective source and drain electrodes defining the ends of its conduction channel and each having a gate electrode, said first and third transistors being of P-channel type and said second and fourth transistors being of N-channel type;
   means for applying an operating potential between the source electrodes of said first and second transistors;
   input and output terminals;
   respective means for connecting the drain electrodes of said first and second transistors to said output terminal;
   means for connecting the gate electrode of said first transistor to said input terminal;

means for connecting the gate electrode of said second transistor to said input terminal;

means for regulating the current flows through the conduction channels of said third and fourth transistors to a prescribed value substantially independent of said operating potential; and means responsive to the resulting gate-to-source voltages of said third and fourth transistors for applying respective potentials proportional to said resulting gate-to-source voltages as the respective gate-to-source voltages of said first and second transistors.

2. A complementary symmetry amplifier according to claim 1 wherein said means responsive to the resulting gate-to-source voltages of said third and fourth transistors for applying respective potentials proportional to said resulting gate-to-source voltages between the respective gate-to-source electrodes of said first and second transistors comprises:

means for subtracting the resulting gate-to-source voltages of said third and fourth transistors from said operating potential to obtain a difference voltage; and means responsive to said difference voltage for applying a potential proportional to said difference voltage between the gate electrodes of said first and second transistors.

3. In a complementary symmetry field-effect transistor amplifier having first and second field effect transistors connected across an operating potential, a method for controlling cross-over current to a predetermined value, said method comprising:

providing third and fourth field-effect transistors;

controlling the current flows in said third and fourth transistors to a prescribed value substantially independent of said operating potential; and applying a potential proportional to the resulting gate-to-source voltages of said third and fourth transistors to the respective gate-to-source electrodes of said first and second transistors, so that the predetermined value of cross-over current in said complementary symmetry amplifier is proportional to said prescribed current in said first and second transistors.

4. A method according to claim 3 wherein said step of applying said potential further comprises the steps of:

subtracting said resulting gate-to-source voltage of said third and fourth transistors from said operating potential to obtain a difference potential; and applying a potential proportional to said difference potential between the gate electrodes of said first and second transistors.

5. A complementary symmetry amplifier comprising:

first and second field-effect transistors, each having respective source and drain electrodes defining the ends of its conduction channel and each having a gate electrode, said first transistor being of P-channel type and said second transistor being of N-channel type;

means for applying an operating potential between the source electrodes of said first and second transistors;

input and output terminals;

means for connecting the drain electrodes of said first and second transistors to said output terminal;

a first resistor connected between the gate electrode of said first transistor and said input terminal;

a second resistor connected between the gate electrode of said second transistor and said input terminal;

a first current supply means connected to the gate electrode of said first transistor for conducting a first current to said first resistor, said first current supply means including a control electrode for receiving a first control signal determining the magnitude of said first current;

a second current supply means connected to the gate electrode of said second transistor for conducting a second current from said second resistor, said second current supply means including a control electrode for receiving a second control signal determining the magnitude of said second current;

means applying first and second control signals to the control electrode of said first current supply means and to the control electrode of said second current supply means respectively, of values for conditioning said first current to be of substantially the same amplitude as said second current; and third and fourth field effect transistors, said third transistor being of similar conductivity type as said first transistor, said fourth transistor being of similar conductivity type as said second transistor; wherein said means applying first and second control signals includes means for regulating the current flow through the conduction channels of said third and fourth transistors to a prescribed value substantially independent of said operating potential and wherein said first and second current supply means provide current amplitudes of values such as to produce a voltage drop across said first and second resistors applied between the respective gates of said first and second transistors conditioning each of said first and second transistors to conduct a maximum cross-over current proportional to said prescribed value of the channel current in said third and fourth transistors.

6. A complementary symmetry amplifier according to claim 5 wherein said regulating means comprises:

third and fourth resistors serially connected between the gate electrodes of said third and fourth transistors;

means for connecting the drain electrodes of said third and fourth transistors to the interconnection of said third and fourth resistors;

a fifth resistor connected at one end to the source electrode of said fourth transistor;

means for applying said operating potential between the source electrode of said third transistor and the other end of said fifth resistor;

a fifth transistor having first and second electrodes defining the ends of its principal current conduction path, and a third electrode, the voltage between the third and first electrodes controlling the conduction of its principal current conduction path, said fifth transistor connected at the second electrode thereof to the gate electrode of said fourth transistor, said fifth transistor connected at the third electrode thereof to one end of said fifth resistor said fifth transistor connected at its first electrode thereof to the other end of said fifth resistor, wherein the third electrode control voltage at said third electrode provides said second control signal for said second current supply means; and means responsive to said third electrode control voltage at the third electrode of said fifth transistor for providing a current through said third and fourth resistors substantially equal to that current provided through the principal current conduction path of said fifth transistor, said means further providing said first control signal for said first current supply means;

wherein said prescribed current through the conduction channels of said third and fourth transistors is substantially equal to the ratio of said third electrode control voltage of said fifth transistor to the value of said fifth resistor.

7. A complementary symmetry amplifier according to claim 5 wherein said regulating means comprises:
third and fourth resistors serially connected between the gate electrodes of said third and fourth transistors;
means for applying said operating potential between the source electrodes of said third and fourth transistors;
means for connecting the drain electrodes of said third and fourth transistors to the interconnection of said third and fourth resistors, that means including
first and second current mirror amplifier means each having a respective input terminal, respective output terminal, and a respective common terminal, said first and second current mirror amplifier means having substantially similar current gain ratios between respective input and output terminals, said input terminal of said first current mirror amplifier means being connected to said drain electrode of said third transistor, said input terminal of said second current mirror amplifier means being connected to said drain electrode of said fourth transistor, said respective common terminals being connected to said interconnection of said third and fourth resistors;
fifth and sixth resistors of substantially equal resistance value each connected at one respective end to the respective output terminal of said first and second current mirror amplifier means;
means for applying an energizing potential between the other end of said fifth resistor and the other end of said sixth resistor; and
fifth and sixth transistors, of complementary conductivity type, each having respective first and second electrodes defining the ends of its respective principal current conduction path, and having respective third electrode, the voltage between its third and first electrodes controlling the conduction of its principal current conduction path, said fifth and sixth transistors having substantially matched similar third electrode voltage-to-principal conduction path current characteristics, wherein said fifth resistor is connected between the third and first electrodes of said fifth transistor, said second electrode of said fifth transistor being connected to the gate electrode of said third transistor, wherein said sixth resistor is connected between the third and first electrodes of said sixth transistor, said second electrode of said sixth transistor is connected to the gate electrode of the fourth transistor;
wherein said fifth and sixth transistors provide substantially matched respective principal conduction path currents through said third and fourth resistors for respectively conditioning said third and fourth transistors to conduct said prescribed current, and wherein the respective third electrode control voltage at the respective third electrodes of said fifth and sixth transistors provides said first and second control signals to said first and second current supply means, respectively.

8. A complementary symmetry amplifier according to claim 5 wherein said regulating means comprises:
a direct connection without substantial intervening impedance between the source electrodes of said third and fourth transistors;
a third resistor connected between the gate and drain electrodes of said fourth transistor;
a fourth resistor connected between the gate and drain electrodes of said third transistor;
means for applying said operating potential between the drain electrode of said third transistor and the gate electrode of said fourth transistor;
a fifth transistor having first and second electrodes defining the ends of its principal current conduction path and a third electrode, the voltage between the third and first electrodes controlling the conduction of its principal current conduction path, said fifth transistor connected at the second electrode thereof to the gate electrode of said third transistor, said fifth transistor connected at the third electrode thereof to the drain electrode of said fourth transistor, said fifth transistor connected at the first electrode thereof to the gate electrode of said fourth transistor;
wherein said prescribed current through the conduction channels of said third and fourth transistors is substantially equal to the ratio of the third electrode voltage of said fifth transistor to the value of said third resistor;
wherein said third electrode control voltage at the third electrode of said fifth transistor provides said second control signal for said second current supply means; and
means responsive to said second control signal for generating said first control signal, that means including
a third current supply means responsive to said second control signal for providing a third current proportional to that from said second supply means; and
current to voltage converter means responsive to said third current for providing said first control signal to said first current supply means.

9. A complementary symmetry amplifier comprising:
first, second, third, and fourth field-effect transistors, each having respective source and drain electrodes defining the ends of its conduction channel and each having a gate electrode, said first and third transistors being of P-channel type and said second and fourth transistors being of N-channel type;
means for applying an operating potential between the source electrodes of said first and second transistors;
input and output terminals;
means for connecting the drain electrodes of said first and second transistors to said output terminal;
means for regulating the current flows through the conduction channels of said third and fourth transistors said regulating means including
means for connecting said third transistor as a diode, including a direct connection without substantial intervening impedance between the drain electrode and the gate electrode of said third transistor; and including means for connecting said fourth transistor as a diode, including a direct connection without substantial intervening impedance between the drain electrode and the gate electrode of said fourth transistor; and including means connecting the conductiion channels of said third and fourth transistors in series; and including a constant current source connected in series with the conduction channels of said third and fourth transistors for supplying a substantially constant current therethrough; and means responsive to the resulting gate-to-source voltages of said third and fourth transistors for applying respective potentials proportional to said resulting gate-to-source voltages between the respective gate-to-source electrodes of said first and second transistors, that means including first and second diode means; and including first and second resistance means; and including means connecting said first and second diode means and said first and second resistance means in series between the gate electrodes of said first and second transistors, said first and second diodes both similarly poled for forward series conduction; and including means for connecting the gate electrodes of said first and second transistors to said input terminal; and including first and second current mirror amplifier means, each having a respective input terminal and respective output terminal, said first and second current mirror amplifier means each having substantially similar current gain ratios between respective input and output terminals, said output terminal of said first current mirror amplifier means being connected to the gate electrode of said first transistor, said output terminal of said second current mirror amplifier means being connected to the gate electrode of said second transistor; and including a third resistance means connected at one end thereof to the input terminal of said first current mirror amplifier means; and including a fifth transistor having first and second electrodes defining the end of a principal current conduction path, and a third electrode, the potential between the first and third electrodes controlling the conduction of its principal current conduction path, said fifth transistor connected at the first electrode thereof to the other end of said third resistance means, said fifth transistor connected at the second electrode thereof to said input terminal of said second current mirror amplifier means, said fifth transistor connected at the third electrode thereof to said series connection of said third and fourth transistors, wherein the potential at said third electrode is equal to the sum of said resulting source-to-gate voltages of said third and fourth transistors.

* * * * *